United States Patent [19]

Cuneo et al.

[11] Patent Number: 4,466,184

[45] Date of Patent: Aug. 21, 1984

[54] METHOD OF MAKING PRESSURE POINT CONTACT SYSTEM

[75] Inventors: Edward A. Cuneo, Westminster; Harold R. Montei, Rowland Heights; Michael Olivieri, Alta Loma, all of Calif.

[73] Assignee: General Dynamics, Pomona Division, Pomona, Calif.

[21] Appl. No.: 445,441

[22] Filed: Nov. 29, 1982

Related U.S. Application Data

[62] Division of Ser. No. 257,055, Apr. 21, 1981.

[51] Int. Cl.$^3$ ............................................. H05K 3/36
[52] U.S. Cl. ..................................... 29/830; 339/17 F
[58] Field of Search ................. 29/827, 830, 842, 843; 174/88 R, 117 FF; 228/180 A; 339/17 F

[56] References Cited

U.S. PATENT DOCUMENTS

| | | | |
|---|---|---|---|
| 3,070,650 | 12/1962 | Stears | 174/88 R |
| 3,257,537 | 6/1966 | Clark | 200/268 |
| 3,293,399 | 12/1966 | Heinrich | 200/252 |
| 3,504,098 | 3/1970 | Clark | 174/68.5 |
| 3,646,670 | 3/1972 | Maeda et al. | 29/830 |
| 3,701,964 | 10/1972 | Cronin | 339/17 F |
| 3,770,874 | 11/1973 | Krieger et al. | 174/68.5 |
| 3,772,179 | 11/1973 | Beer | 204/197 |
| 3,853,382 | 12/1974 | Lazar | 339/95 R |
| 3,887,760 | 6/1975 | Krieger et al. | 174/68.5 |
| 3,982,320 | 9/1976 | Buchoff | 29/883 |
| 4,092,057 | 5/1978 | Walton | 174/117 FF X |
| 4,116,517 | 9/1978 | Selvin et al. | 339/17 F |
| 4,125,310 | 11/1978 | Reardon et al. | 339/17 F |
| 4,168,876 | 9/1979 | Balde | 339/176 MP |
| 4,184,729 | 1/1980 | Parks et al. | 29/830 X |

OTHER PUBLICATIONS

IBM Tech. Discl. Bull., vol. 9, No. 10, Mar. 1967, pp. 1283, 1284 by Johnson, Jr.

Primary Examiner—Howard N. Goldberg
Assistant Examiner—Carl J. Arbes
Attorney, Agent, or Firm—Henry M. Bissell; Edward B. Johnson

[57] ABSTRACT

A system of disassemblable contact junctions for prefabricated conductor paths, such as may be provided on printing wiring boards, flexible printed cables or the like, Each contact junction includes a pressure point contact attached to an associated conductor path. Both the pressure point contact and the opposed conductor path are coated with solder or equivalent. Rigid blocks on opposite sides of the two sets of circuit conductors with an interspersed pad of compliant material, such as rubber, hold the assembly together under substantial pressure. Each of the pressure point contacts is formed with a ridge along the contacting face which, under the pressure developed by the assembly, penetrates through the oxide surfaces of the contacting solder layers, breaking the oxide surfaces and forming a gas tight electrical connection provided by the cold flow of the solder. The assembly can be readily disassembled and rejoined in case repairs are needed or it is desired to substitute connections to another set of prefabricated conductor paths. The individual contacts may be formed by etching a sheet of copper alloy to develop a comb bearing the contacts, chemically milling the pressure point contact elements along the end of the comb to form the raised ridges on the base portions, coating and attaching the contacts with solder on a series of prefabricated conductors while temporarily mounting them in position by means of a soldering tool, and then breaking off the comb to leave the contacts in the desired positions.

8 Claims, 10 Drawing Figures

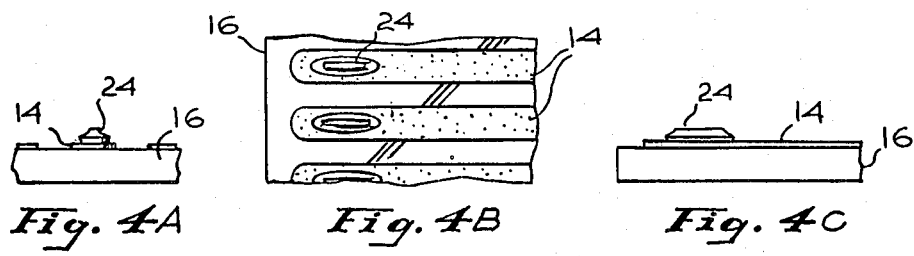
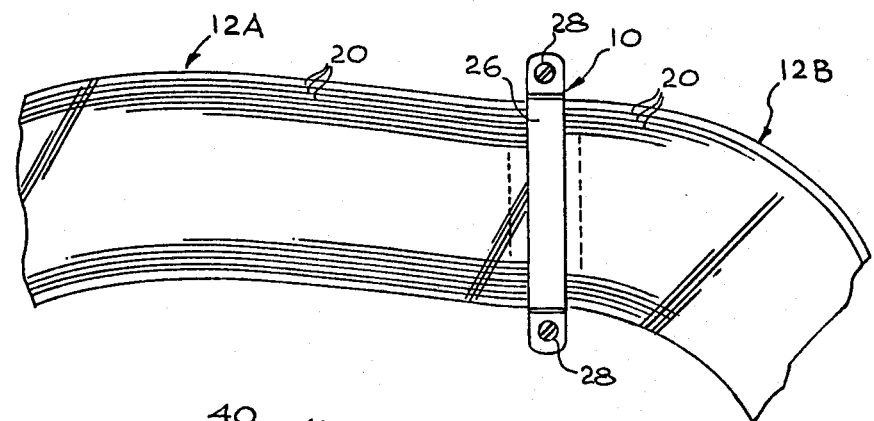
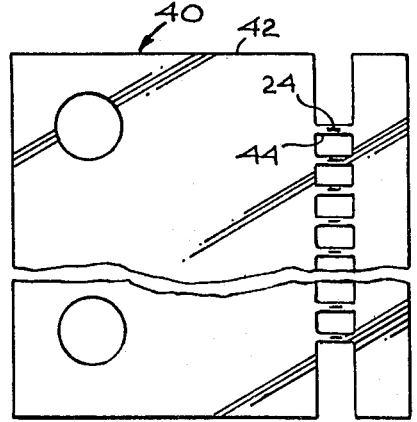
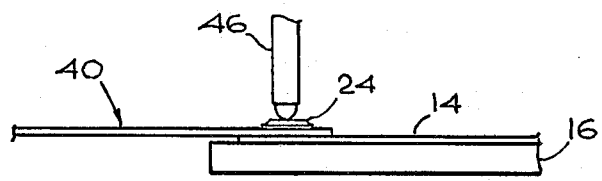

METHOD OF MAKING PRESSURE POINT CONTACT SYSTEM

This is a division, of application Ser. No. 257,055, filed Apr. 24, 1981.

Background of the Invention

1. Field of the Invention.

This invention relates to electrical contacting systems and, more particularly, apparatus for providing reliable low-resistance contact between sets of prefabricated electrical conductors.

2. Description of the Prior Art.

The problem of achieving uniform, low cost, reliable connections in electrial circuitry has long plagued the industry. The difficulties in achieving such connections are exacerbated in the case of electrical conductors included in prefabricated sub-circuits such as printed wiring boards (PWBs) or the like. The electrical connections between the individual circuit components mounted on the board and the electrical conductor paths can be readily effected by soldering, but developing the necessary reliable contacts between the conductors of one board and interface terminals is another matter. The problem is recognized and discussed in the Lazar U.S. Pat. No. 3,853,382 in the section entitled "State of the Art and the Problem", incorporated by reference herein.

Numerous attempts have been made to develop a satisfactory solution to the problem. Clark, in U.S. Pat. Nos. 3,257,537 and 3,504,098, discloses printed circuit panels which may include copper conductors with expensive noble metal pads at the contact points. The aforementioned Lazar patent discloses high pressure electrical contacts coated with a deformable ductile white metal which are forced against a contact surface by individual spring members to develop a gas-tight seal in the contact area. However, the disclosed arrangements present certain disadvantages in that the structural configurations require substantial minimum spacing, relative to the minimum spacing which is provided for adjacent circuit conductors on presently available printed wiring boards (PWBs) and flexible printed cables (FPCs)—0.1 inch centers for the patented structure as contrasted with 0.025 inch centers or less in present circuit boards and cables. Moreover, each of the springs of the Lazar patent arrangement requires an individual solder connection to a wire conductor, which is a disadvantage in the kind of connectors to which the present invention is directed.

The Reardon II U.S. Pat. No. 4,125,310 discloses a so-called "Gold Dot" system which requires special art work and gold plating to provide contact surfaces which do not tarnish in normal environments. Such contacts are costly to fabricate and difficult to repair, since in the event of damage to one of the contacts, the harness or sub-assembly must be passed through a replating operation to restore the original condition.

The Beer U.S. Pat. No. 3,772,179 discloses a screw point contact for establishing a low-resistance electrical connection between two circuit path members. U.S. Pat. Nos. 3,293,399 of Heinrich and 3,770,874 and 3,887,760 of Krieger et al. disclose various contact systems of other types. None of these are directly related to the invention disclosed and claimed herein.

SUMMARY OF THE INVENTION

In brief, arrangements in accordance with the present invention include a plurality of pressure point contacts (PPCs), sometimes referred to as bumps, each of which comprises a formed, raised ridge on a solderable metallic member. The member is solder coated and attached to a printed circuit conductor, e.g. by soldering. A multiple contact connector assembly is developed by placing the terminal conductors of a flexible printed cable, preferably with a solder layer thereon, over the PWB/PPC combination using a suitable registration device, e.g. guide pins. The FPC is backed up with a compliant material such as rubber, and the assembled sandwich is squeezed between two rigid blocks or bars using fastening means such as screws. The pressure formed at the pressure points of the PPCs causes the oxide layers, normally present on the solder coatings, to shatter. The fresh solder underneath the oxide layers is caused to flow together, forming a gas tight electrical connection.

The individual bumps are extremely small, thereby accommodating multiple connections between conductors of extremely close spacing. In one embodiment, the bumps are approximately 0.004 inch wide, 0.009 inch long and 0.005 inch high in overall dimensions. These contacts, mounted as described, accommodate connections between conductors on 0.025 inch centers.

The blocks or bars are preferably fabricated of aluminum or steel, being approximately one-quarter inch square and of a length corresponding to the width of the connector, typically 1½ inches. For wider connectors, larger bars may be used or additional fasteners may be interspersed between the fasteners at the ends of the bars.

The system of the present invention develops a miniumum of 0.5 pounds force per contact, which is equivalent to from about 10,000 psi of contact area up to about 40,000 or 50,000 psi of contact area, depending on the configuration. These pressures are sufficient to break through the oxide layers on the solder coatings and develop cold flow of the solder so that a good low-resistance contact is established and a gas tight seal is effected which prevents further oxidation of the solder within the contact region. The layer of compliant material assists in distributing the compression forces evenly over all of the contacts in the connector sandwich. It also serves to take up any tolerances which may exist with respect to minor differences in contact dimensions. The entire assembly is very effective against momentary circuit interruption due to shock and vibration resonances. Prototypes have been vibration tested down to periods of less than ten nanoseconds without any indication of discontinuities in the circuit connections. Thus, the connector is extremely reliable and well adapted for use in digital circuits, where a discontinuity of only one millisecond can distort the digital data being transmitted.

In a preferred method of fabricating the PPCs of the present invention, a sheet of copper alloy is prepared and photoresist is disposed over both sides of the sheet. The photoresist is suitably illuminated through masks and developed to remove the photoresist over those areas of the metal which are to be removed, for example by chemical milling; namely, the spaces between the bump portions and the connecting portions that support the bumps in a comb-like structure formed by the etching. The etching is typically done in ferric chloride solution. The photoresist, developing and etching processes are practices well known to those skilled in the art. Other suitable forming processes include electro discharge, machining, additive electroplating, and mechanical forming.

In another particular arrangement in accordance with the present invention, the PPCs may be affixed to the conductors of a flexible printed cable, rather than to a printed wiring board. The contacts are then subsequently pressed against corresponding conductors on a printed wiring board or, in another alternative arrangement, another flexible printed cable. In the latter example, the system of the present invention may be utilized to couple together two flexible printed cables.

Brief Description of the Drawing

A better understanding of the present invention may be had from a consideration of the following description, taken in conjunction with the accompanying drawing in which:

FIGS. 4A, 4B, and 4C are end, plan and side elevational views, respectively, showing a pressure point contact element mounted on a single conductor lead of FIG. 2;

FIG. 5 is a plan view of an alternative arrangement in accordance with the invention;

FIG. 6 illustrates a set of pressure point contact elements at one stage in the fabrication process; and FIG. 7 illustrates a pressure point contact element in another stage of the fabrication process.

Description of the Preferred Embodiments

Figure 1:
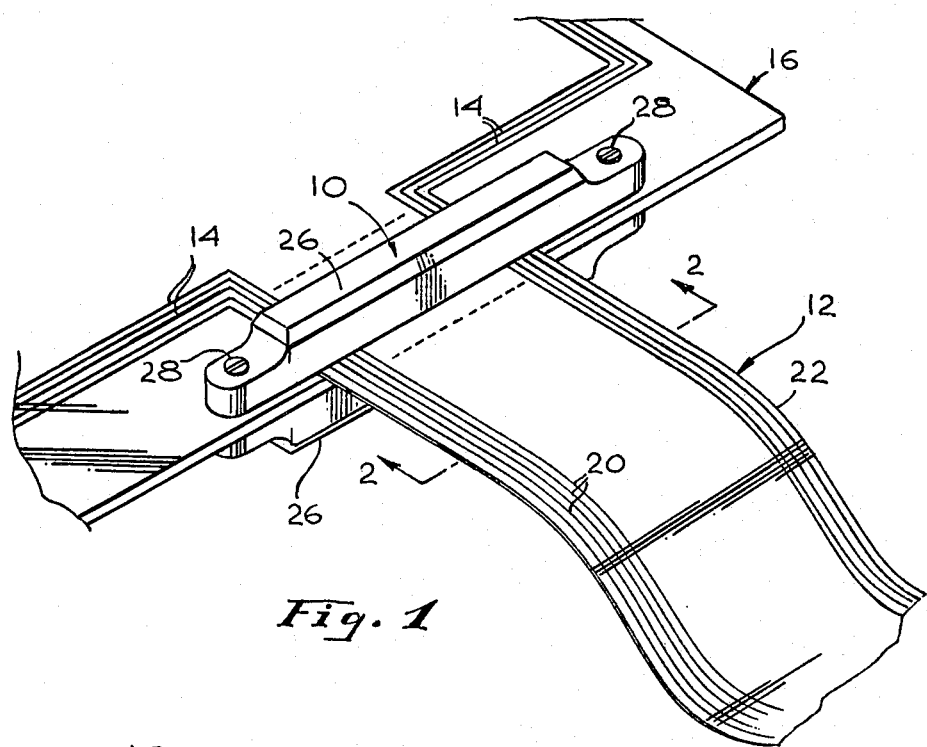
FIG. 1 is a partial perspective view showing one particular arrangement in accordance with the invention.
Figure 2:
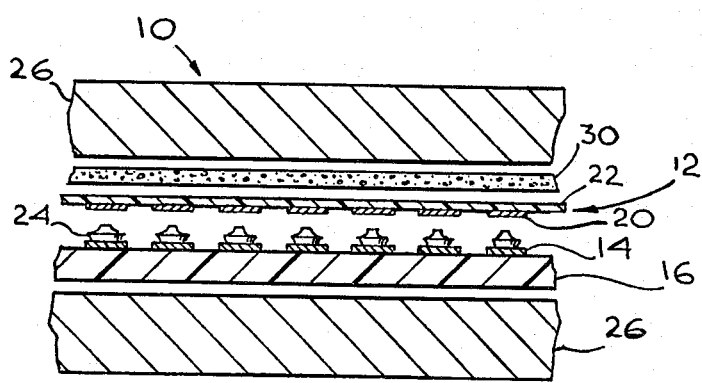
FIG. 2 is a sectional view showing details of structure of the invention, taken along the plane 2—2 of FIG. 1, looking in the direction of the arrows (prior to assembly)

As particularly shown in FIGS. 1 and 2, one particular arrangement in accordance with the invention comprises a connector 10 coupling a flexible printed cable 12 to a plurality of conductors 14 on a printed wiring board 16. The flexible printed cable 12 is provided with a plurality of individual conductors 20 affixed to a carrier 22. Each of the circuit board conductors 14 is provided with a pressure point contact element 24, preferably secured thereto by solder which coats the contact element 24. The cable conductors 20, in the region of the connector 10, are also coated with solder, at least along the portion of their surface opposite the contact element 24. The connector 10 further includes a pair of bars or blocks 26 on opposite sides of the board 16 and cable 12. The bars 26 are fastened together by fastening means such as screws 28. A layer of compliant material 30, such as rubber, is interposed between the cable 12 and the adjacent bar 26.

With the various elements arranged as shown in FIG. 2, squeezing of the bars 26 together causes the contact elements 24 to bear against the cable conductors 20, breaking the oxide layers on the solder coatings as previously described and establishing a gas tight seal with low resistance contacts between the coupled conductors.

Figure 3A:
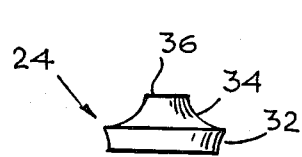
FIGS. 3A and 3B are, respectively, end and plan views of a pressure point contact element of FIG. 2.
Figure 3B:
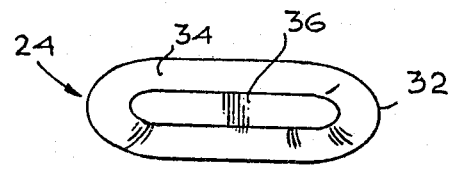

A contact element 24 is shown in the enlarged drawings of FIGS. 3A and 3B as comprising a lower base or bed portion 32 and an upraised ridge portion 34. The ridge portion 34 is developed by chemical milling of the element 24 from a sheet of copper alloy to have bevelled sides culminating in a central plateau region 36. This configuration with the narrow plateau 36 is preferable to a true knife edge or point which, under the required pressures, may tend to cut through the solder to the metal under the solder layer, thereby eliminating the solder layer between the contact element and the circuit conductor.

FIGS. 4A–4C show a contact element 24 mounted on a circuit conductor such as 14 or 20 (FIG. 2). The element 24 is preferably affixed to the conductor 14 by soldering, a step which at the same time deposits a layer of solder over the operative surfaces of the contact element 24. Mounting in this fashion serves to hold the elements 24 in proper position for the further step of completing the connector assembly as particularly shown and described above with respect to FIGS. 1 and 2.

The connector of the present invention may also be used to provide connections between two different flexible printed cables such as cables 12A and 12B shown in FIG. 5. The bars 26 and fastening means 28 correspond to those depicted in FIG. 2. For the arrangement of FIG. 5, the pressure point contact elements 24 are mounted in the manner previously described on conductors of one of the cables 12A or 12B and then brought into pressure contact with conductors of the other cable by squeezing the bars 26 together with a compliant layer 30 positioned between one of the bars 26 and one of the cables.

As a further variation of the connector arrangement shown in FIG. 2, the pressure point contact elements 24 may be mounted on conductors of the flexible printed cable, rather than on the conductors of the printed wiring board. In such an arrangement, the cable carrier 22 and board 16 of FIG. 2 would be interchanged. The compliant layer 30 would still be placed between the cable and the adjacent bar 26.

FIG. 6 illustrates a plurality of contact elements 24 after fabrication in the manner described above. The elements 24 are formed on a comb developed by etching a prepared sheet of copper alloy. Unetched bridging portions 42 provide support for the individual reed members 44 which hold the elements 24. During the final step of mounting the elements 24 on the conductors 14 of the board 16 (see FIG. 7), the comb 40 is aligned in registration with the board conductors 14, after which a soldering tool 46 is mounted onto the circuit structure while solder, previously applied to the entire structure, is reflowed to the elements 24. Thereafter the soldering tool 46 is removed and the comb 40 is broken away from the elements 24 which remain mounted on their respective conductors 14.

If desired, the elements 24 may be formed integrally on the circuit conductors of a backing member such as a printed wiring board. In such case, the example of FIG. 6 would be modified so that the copper alloy sheet is mounted on a board, the bridging elements 42 would be etched away and the reed members 44 would become the printed circuit conductors. The ends of the conductors would be formed, as by chemical milling to develop the described configuration of the pressure point contact elements 24.

Arrangements in accordance with the present invention provide an improved connector system particularly adapted for interconnecting the conductors of printed wiring boards, flexible printed cables and the like. This connecting system effectively eliminates problesm resulting from oxidation of conducting solder layers and from vibration and shock effects on the connector contacts. The connector is readiy disassemblable, merely by removing the fastening means and bars which hold the contacts together. Thereafter, the connected circuits can be separated and other circuits substituted, if desired, with the connector being reassembled as before.

Although there have been described above specific arrangements of a pressure point contact system and methods of fabrication in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. The method of fabricating pressure point contacts for an electrical connector comprising the steps of:
    forming a pressure point contact element to develop an upraised portion having a narrow ridge thereon with bevelled sloping sides;
    mounting a plurality of such elements on a plurality of first conductors;
    applying solder to said elements and conductors and to a plurality of second conductors;
    placing the first and second conductors in registration with each other in opposed juxtaposition, the upraised portions of the pressure point contact elements facing the second conductors;
    positioning a pair of bars on opposite sides of the first and second conductors with a resilient pad located underneath one of the bars; and
    squeezing the bars together, thereby compressing the conductors and pressure point contact elements together, until the pressure point contact elements break through oxide layers on the soldered surfaces and cause the solder to cold flow to develop a gas tight seal.

2. The method of claim 1 further including the step of fastening the bars in the compressed position to develop an electrical circuit connector.

3. The method of claim 1 wherein the forming step comprises:
    preparing a sheet of copper alloy for etching;
    applying a coating of photoresist to both sides of the sheet;
    exposing the photoresist in a pattern corresponding to a comblike structure including a plurality of contact elements;
    removing photoresist from the regions to be etched; and
    etching the copper alloy to remove unwanted portions thereof.

4. The method of claim 1 wherein the forming step comprises developing the upraised portion with a narrow flat plateau along the top of the ridge.

5. The method of claim 4 wherein the forming step further includes shaping the point contact element to have a base portion forming a juncture line with the bevelled sloping sides, the sloping sides extending between the base portion and the sides and ends of the plateau on the narrow ridge.

6. The method of claim 5 wherein the forming step further comprises forming the base portion with a generally rectangular horizontal cross-section and aligning the ridge in the direction of the longer dimension of the cross-section.

7. The method of claim 1 including forming a plurality of pressure point contact elements, each having an upraised portion with a narrow ridge thereon and bevelled sloping sides dropping away from said ridge.

8. The method of fabricating pressure point contacts for an electrical connector comprising the steps of:
    forming a pressure point contact element to develop an upraised portion having a narrow ridge thereon with bevelled sloping sides;
    mounting a plurality of such elements on a plurality of first conductors;
    applying solder to said elements and conductors and to a plurality of second conductors;
    placing the first and second conductors in registration with each other in opposed juxtaposition, the upraised portions of the pressure point contact elements facing the second conductors;
    positioning a pair of bars on opposite sides of the first and second conductors with a resilient pad located underneath one of the bars; and
    squeezing the bars together, thereby compressing the conductors and pressure point contact elements together, until the pressure point contact elements break through oxide layers on the soldered surfaces and cause the solder to cold flow to develop a gas tight seal;
    the forming step comprising:
    preparing a sheet of copper alloy for etching;
    applying a coating of photoresist to both sides of the sheet;
    exposing the photoresist in a pattern corresponding to a comb-like structure including a plurality of contact elements;
    removing photoresist from the regions to be etched; and
    etching the copper alloy to remove unwanted portions thereof;
    the mounting step including:
    positioning the comb-like structure with the pressure point contact elements in registration with the first conductors;
    positioning a soldering tool against the row of elements;
    applying heat to reflow solder on the elements and adhere them to adjacent conductors; and
    breaking the remainder of the comb-like structure away from the elements.

* * * * *